United States Patent
Nakayama et al.

(10) Patent No.: US 6,492,669 B2
(45) Date of Patent: Dec. 10, 2002

(54) SEMICONDUCTOR DEVICE WITH SCHOTTKY ELECTRODE HAVING HIGH SCHOTTKY BARRIER

(75) Inventors: Tatsuo Nakayama, Tokyo (JP); Yuji Ando, Tokyo (JP); Hironobu Miyamoto, Tokyo (JP); Kazuaki Kunihiro, Tokyo (JP); Yuji Takahashi, Tokyo (JP); Kensuke Kasahara, Tokyo (JP); Nobuyuki Hayama, Tokyo (JP); Yasuo Ohno, Tokyo (JP); Kouji Matsunaga, Tokyo (JP); Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/892,567

(22) Filed: Jun. 28, 2001

(65) Prior Publication Data

US 2002/0017696 A1 Feb. 14, 2002

(30) Foreign Application Priority Data

Jun. 29, 2000 (JP) .......................................... 2000-196749

(51) Int. Cl.$^7$ ................................................ H01L 29/80
(52) U.S. Cl. ........................ 257/282; 257/281; 257/471
(58) Field of Search ................................. 257/280–284, 257/260, 267, 453–454, 28, 19, 53, 76, 155, 189, 192, 194, 471, 472; 438/570, 560, 576

(56) References Cited

U.S. PATENT DOCUMENTS 5,471,073 A * 11/1995 Kohno ........................ 257/108
6,316,793 B1 * 11/2001 Sheppard et al. ........... 257/103

FOREIGN PATENT DOCUMENTS

| JP | 11-261052 | 9/1999 |
| JP | 11-261053 | 9/1999 |
| JP | 11-274474 | 10/1999 |
| JP | 2000-68498 | 3/2000 |

OTHER PUBLICATIONS

Lei Wang et al., "High barrier height GaN Schottky diodes: Pt/GaN and Pd/GaN", Applied Physics Letters vol. 68 (No. 9), Feb. 26, 1996, p. 1267.

Egawa, et al., "Recessed gate AlGaN/GaN modulation–doped field–effect transistors on sapphire", Applied Physics Letters vol. 76 (No. 1), (2000), p. 121.

* cited by examiner

Primary Examiner—David Nelms
Assistant Examiner—Long K. Tran
(74) Attorney, Agent, or Firm—McGinn & Gibb, PLLC

(57) ABSTRACT

A carrier travel layer is formed on the substrate of a semiconductor device with a buffer layer interposed, and a spacer layer and carrier supply layer are then formed on this carrier travel layer. On the carrier supply layer are provided a source electrode and a drain electrode, and a gate electrode is provided on an interposed Schottky layer. The carrier supply layer is composed of AlGaN and has tensile strain. The Schottky layer is composed of InGaN and has compressive strain. A negative piezoelectric charge is induced on the carrier supply layer side of the Schottky layer, and a positive piezoelectric charge is induced on the opposite side of the Schottky layer, whereby a sufficient Schottky barrier height is obtained and leakage current is suppressed.

20 Claims, 9 Drawing Sheets

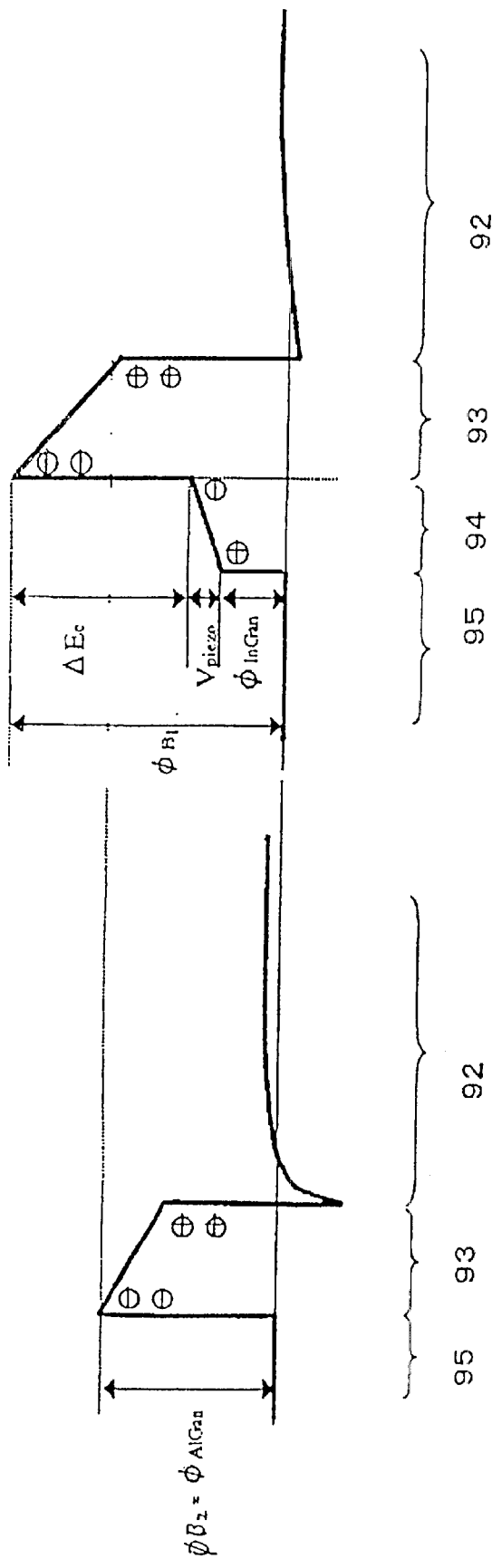

SEMICONDUCTOR DEVICE WITH SCHOTTKY ELECTRODE HAVING HIGH SCHOTTKY BARRIER

BACKGROUND OF THE INVENTION

1. Field of the Invention

The present invention relates to semiconductor device that is provided with a Schottky electrode, and more particularly to a field-effect transistor having high breakdown resistance for application in high-frequency and high-temperature operation.

2. Description of the Related Art

As disclosed by, for example, Lei Wang et al. (Applied Physics Letters Vol.68 (No.9) pp.1267 (1996)), it is known that GaN semiconductors have a higher Schottky barrier than other Group III-V compound semiconductors.

According to the publication mentioned above, Wang et al. fabricated Pt/GaN and Pd/GaN Schottky diodes and measured the Schottky barrier heights of each. The Schottky barrier height of a Pt/GaN Schottky diode was 1.13–1.27 eV, and the Schottky barrier height of a Pd/GaN Schottky diode was 0.96–1.24 eV. These values are higher than the GaAs Schottky barrier height (0.7 eV or lower) or the InP Schottky barrier height (0.5 eV or lower).

In a heterojunction field-effect transistor (HJFET), an AlGaN layer is normally used as the semiconductor layer (electron barrier layer) that contacts a Schottky electrode. This is disclosed by, for example, Egawa et al. (Applied Physics Letters Vol.76 (No.1) pp.121 (2000)).

FIG. 1 is a sectional view of a field-effect transistor disclosed by Egawa, et al. As shown in FIG. 1, GaN seed formation layer 1002 having a film thickness of 30 nm, GaN layer 1003 having a film thickness of 2.5 μm, AlGaN spacer layer 1004 having a film thickness of 10 nm, n-type AlGaN carrier supply layer 1005 having a film thickness of 20 nm, and n-type GaN cap layer 1006 having a film thickness of 20 nm are formed by metalorganic vapor phase epitaxy method on sapphire substrate 1001. A portion of GaN cap layer 1006 and AlGaN carrier supply layer 1005 is then removed by a reactive ion etching (RIE) method. Source electrode 1007 and drain electrode 1008 are then formed from Ti/Al, and gate electrode 1009 is formed from Pt/Ti/Au, thereby completing the field-effect transistor. Because the AlGaN layer has a larger band gap than a GaN layer, the Schottky barrier height at the interface of the Pt and AlGaN is higher than the Schottky barrier height at the interface of the Pt and GaN.

Nevertheless, Schottky barrier height is insufficient in the configuration of the prior-art during operation in which a Schottky voltage is applied in the positive direction. In particular, in the case of a field-effect transistor in which current across the source and drain is 0 when gate voltage is not applied, i.e., a field-effect transistor that operates in enhancement mode, there is the problem that the leakage current increases and the amplification factor deteriorates during operation, i.e., when a Schottky voltage is applied in the positive direction.

As a countermeasure, a method can be considered in which the thickness of the AlGaN layer is increased to raise the Schottky barrier thickness and decrease the leakage current. However, limitations exist in relation to the critical layer thickness, and increasing the thickness of the AlGaN layer sufficiently to obtain adequate Schottky barrier thickness is problematic. Increasing the Al composition in the AlGaN layer to raise the Schottky barrier height can also be considered. However, increasing the Al composition component brings about an increase in tensile strain within the layer and a decrease in the critical layer thickness, and obtaining sufficient Schottky barrier height is again problematic.

SUMMARY OF THE INVENTION

In view of the above-described problems, it is an object of the present invention to realize a Schottky barrier having sufficient height, which could not be obtained in the prior art, and thus effectively suppress leakage current.

To solve the above-described problems, the present invention prevents leakage current by forming an energy band structure having a Schottky barrier of two-step construction and having sufficient height by providing a layer having a compressive strain below a Schottky electrode, as shown, for example, in FIGS. 2A and 2B.

In a case in which III-V semiconductor layers having different lattice constants are formed, internal strain occurs in the semiconductor layers, and it is known that the piezoelectric effect that is brought about by this internal strain generates an internal field in the layers. For example, in a case in which, on the (0001) plane of a thick base layer that is composed of a III-nitride semiconductor, a material is formed that has a larger lattice constant than the thick base layer, compressive strain will remain in the layer if the film thickness of the formed material falls below the critical layer thickness at which dislocation generates due to lattice mismatch. The piezoelectric effect brought about by this compressive strain generates an internal field in the direction from the interior of the layer toward the surface. If the formed material has a smaller lattice constant than the thick base layer, on the other hand, tensile strain will remain in the layer and an internal field will be generated in the opposite direction. The present invention takes advantage of this piezoelectric effect to increase the Schottky barrier height. In this specification, the (0001) plane in the III-nitride semiconductor crystal refers to the plane that is shaded with diagonal lines in FIG. 3.

A semiconductor device of this invention comprises: a first electron barrier layer, a second electron barrier layer that is formed on this first electron barrier layer either directly or on an interposed spacer layer, and a Schottky electrode that is formed on this second electron barrier layer. A negative piezoelectric charge is induced on the first electron barrier layer side of the second electron barrier layer, and positive piezoelectric charge is induced on the Schottky electrode side of the second electron barrier layer.

According to this semiconductor device, the effect of the piezoelectric charge that is induced in the second electron barrier layer can effectively increase the Schottky barrier height of the first electron barrier layer, thereby enabling an effective suppression of leakage current.

In this semiconductor device, moreover, adopting a construction in which a negative piezoelectric charge is induced on the second electron barrier layer side of the first electron barrier layer and a positive piezoelectric charge is induced on the opposite side of the first electron barrier layer further increases the Schottky barrier height that is brought about by the piezoelectric charges that are induced in the second electron barrier layer.

If the first and second electron barrier layers are both formed from III-nitride semiconductor materials, good piezoelectric polarization can be produced and the Schottky barrier height is further increased by the piezoelectric charges that are induced in the second electron barrier layer.

Another example of the semiconductor device of this present invention comprises: a base layer, a first electron barrier layer that is formed directly on the base layer, a second electron barrier layer that is formed either directly on this first electron barrier layer or on an interposed spacer layer, and a Schottky electrode that is formed on this second electron barrier layer. The base layer, the first electron barrier layer, and the second electron barrier layer are all wurtzite III-nitride semiconductors that take the (0001) plane as the principal plane. In addition, the second electron barrier layer has compressive strain.

In this semiconductor device, the second electron barrier layer has compressive strain, and a piezoelectric charge can therefore be induced in the second electron barrier layer and the Schottky barrier height in the first electron barrier layer can be effectively raised, thereby effectively suppressing leakage current.

In this semiconductor device, moreover, if a structure is adopted in which the first electron barrier layer has tensile strain, the piezoelectric charge that is induced in the second electron barrier layer further increases the Schottky barrier height.

If the average of the lattice constant in the horizontal plane that is perpendicular to the direction of thickness is defined as the average lattice constant, making the average lattice constant of the second electron barrier layer greater than that of the base layer can produce compressive strain in the second electron barrier layer and thereby obtain a semiconductor device of the above-described structure. The average lattice constant is not the lattice constant for a multilayer film, but rather, the lattice constant that is specific to the material that constitutes the layer. For example, in a case in which an AlGaN layer having an a-axis lattice constant that is smaller than that of GaN is grown above a thick base layer that is composed of GaN in which the (0001) plane is the principal plane, tensile strain occurs in the AlGaN layer, and the lattice spacing of the GaN layer and AlGaN layer is equal in the horizontal plane that is perpendicular to the direction of layer thickness. Average lattice constant in this invention does not relate to lattice spacing when this type of strain is in effect, but rather, to such lattice constant that is inherent to the material. The lattice constant in the horizontal plane that is perpendicular to the direction of layer thickness coincides with the a-axis lattice constant if there is no inclination to the (0001) plane.

In this semiconductor device, making the average lattice constant of the first electron barrier layer smaller than that of the base layer increases the Schottky barrier height due to the piezoelectric charge that is induced in the second electron barrier layer.

A construction is preferably adopted in which the base layer is made up by $Al_\alpha Ga_{(1-\alpha)}N$; ($0 \leq \alpha \leq 1$), the first electron barrier layer is composed of $Al_\beta Ga_{(1-\beta)}N$; ($\alpha \leq \beta \leq 1$), and the second electron barrier layer is composed of $In_x Ga_y Al_{(1-x-y)}N$; ($0 < x \leq 1$, $0 \leq y < 1$).

In addition, a construction is preferably adopted in which the base layer is composed of $Al_\alpha Ga_{(1-\alpha)}N$; ($0 < \alpha \leq 1$), the first electron barrier layer is composed of $Al_\beta Ga_{(1-\beta)}N$; ($\alpha \leq \beta \leq 1$), and the second electron barrier layer is composed of $Al_\gamma Ga_{(1-\gamma)}N$; ($0 \leq \gamma < \alpha$).

In this way, the Schottky barrier height can be sufficiently increased and leakage current can be effectively suppressed.

The present invention is particularly effective when applied to a field-effect transistor, such as a High Electron Mobility Transistor (HEMT) or Metal Semiconductor Field-Effect Transistor (MESFET). In other words, if a construction is adopted in semiconductor devices of each of the above-described configurations in which the Schottky electrode is gate electrode and source and drain electrodes are further provided, the effect of the present invention is more pronounced, gate leakage current is further decreased, and field-effect transistors of superior reliability can be obtained.

In this case, the source electrode and drain electrode are preferably formed in contact with a III-nitride semiconductor layer having tensile strain or having no strain. Adopting this configuration simultaneously raises the Schottky barrier height in the gate electrode and enables a reduction in the contact resistance of the source electrode and drain electrode.

Another example of a semiconductor device of the present invention comprises a plurality of wurtzite III-nitride semiconductor layers of that take the (0001) plane as the principal plane, and a gate electrode, source electrode, and drain electrode that are formed over the semiconductor layers, The plurality of III-nitride semiconductor layers include a first layer composed of GaN and a second layer composed of $Al_x Ga_{(1-x)}N$; ($0 < x \leq 1$). The gate electrode is formed so as to contact the first layer, and the source and drain electrodes are formed so as to contact the second layer.

In field-effect transistors of the prior art, gate electrodes are normally provided on AlGaN to increase the Schottky barrier height, and the source and drain electrodes are provided on doped GaN to reduce contact resistance. In the present invention, in contrast, the gate electrode is provided on GaN to increase the Schottky barrier height, and the source and drain electrodes are provided on AlGaN to increase the ohmic property of the electrodes. The Schottky barrier height of the gate electrodes can be increased because the surface of wurtzite GaN in which the (0001) plane is the principal plane has negative polarity. The Schottky barrier height can be increased because the GaN layer has a negative polarity in the vicinity of the interface on the gate electrode side. The effect of the negative polarity of the GaN surface and the effect of the above-described second electron barrier layer are each produced by different mechanisms, but the latter effect can obtain a more marked increase in the Schottky barrier height. A more effective configuration can be obtained if the GaN layer is caused to have compressive strain by adopting a method such as using AlGaN for the base layer.

The effects of the present invention are next described with reference to the accompanying drawings.

Wurtzite III-nitride semiconductors exhibit a piezoelectric effect in which potential is generated by the strain of crystals. For example, if AlGaN layer 1102 having a smaller lattice constant than a GaN layer is formed on GaN layer 1101 in which the (0001) plane is the principal plane, a positive charge is produced in the AlGaN on the side of heterojunction with GaN (on the side of the (000–1) plane of the AlGaN layer) and a negative charge is produced on the opposite side (on the (0001) plane side of the AlGaN layer), as shown in FIG. 4A. Conversely, if InGaN layer 1104 having a greater lattice constant than a GaN layer is formed on GaN layer 1103 in which the (0001) plane is the principal plane, a negative charge is produced in the InGaN layer on the side of the heterojunction with the GaN (the (000–1) plane side of the InGaN layer) and a positive charge is produced on the opposite side (the (0001) plane side of the InGaN layer), as shown in FIG. 4B.

In a Schottky electrode construction of the prior art, the Schottky barrier height is secured by adopting the above-described energy band structure of FIG. 4A. For example, in the HJFET (Heterojunction Field-Effect Transistor) shown in FIG. 1, AlGaN spacer layer 1004 and AlGaN carrier supply layer 1005 are provided on GaN layer 1003, and gate electrode 1009 is further formed over these layers to form an energy band structure as shown schematically in FIG. 4A.

In this configuration, however, there is a limit to the extent that the Schottky barrier height can be further increased. Although the Schottky barrier height can be increased if the AlGaN layer immediately underlying the gate electrode is made thick, there is a limit to the film thickness in relation to the critical layer thickness as described in the foregoing explanation, and there is constantly a limit to increasing the Schottky barrier height.

In the present invention, in contrast, an improvement in barrier height by means of the piezoelectric effect can be contrived by providing a semiconductor layer that has compressive strain directly beneath the electrode. This point is next explained with reference to FIGS. 5A–5D.

FIG. 5C shows an HJFET of the prior art, and FIG. 5A shows the corresponding band chart. Thick GaN base layer 92 is formed on substrate 90 with buffer layer 91 interposed, and AlGaN layer 93 and electrode 95 are formed on this GaN base layer 92. The crystal growth plane of each of the III-nitride semiconductor layers is the (0001) plane.

The HJFET construction according to the present invention, on the other hand, is shown in FIG. 5D, and the corresponding band chart is shown in 5B. This construction differs from the construction shown in FIGS. 5A and 5C in that InGaN layer 94 (the second electron barrier layer) is provided between AlGaN layer 93 (the first electron barrier layer) and electrode 95.

The Schottky barrier height can be effectively increased in the HJFET of the present invention because this InGaN layer 94 has compressive strain in the horizontal plane that is perpendicular to the direction of thickness. In this HJFET, the relationship of size of the crystal lattice constants of the semiconductor layer and thick GaN base layer 92 determines whether the internal strain of each semiconductor layer is compressive or tensile. Compressive strain in the surface occurs because the lattice constant (the a-axis lattice constant) in the horizontal plane that is perpendicular to the direction of thickness of InGaN layer 94 is greater than that of GaN base layer 92. As a result, a piezoelectric effect operates such that a positive charge is produced on the (0001) plane side and a negative charge is produced on the (000–1) plane side. The barrier height between a Schottky metal and III-nitride semiconductor is determined by the substances, and the conduction band energy of a III-nitride semiconductor that takes the Fermi level of the metal as a reference increases with distance from the interface of the metal and semiconductor. In other words, the barrier height for electrons increases with increasing distance from the interface between the metal and semiconductor. Thus, the leakage current at a Schottky interface can be reduced compared to the prior-art example (FIG. 5A), and a superior current amplification characteristic can be realized even when the gate bias is positively applied.

The above-described points are next explained in greater detail. The Schottky barrier height $\phi B1$ in the energy band structure of FIG. 5B is represented by the following equation:

$$\phi B1 = (\phi InGaN + \Delta Ec + V_{piezo})$$

$\phi InGaN$ is the Schottky barrier height of InGaN.

$\Delta Ec$ is the value of ((the energy of the lower end of the conduction band of AlGaN)—(the energy of the lower end of the conduction band of InGaN)).

$V_{piezo}$ is the potential difference caused by polarization occurring in InGaN layer 93 due to the piezoelectric effect.

In contrast, the Schottky barrier height $\phi B2$ in the energy band structure of FIG. 5A is represented by the following equation:

$$\phi B2 = \phi AlGaN$$

$\phi AlGaN$ is the height of the Schottky barrier of AlGaN.

The amount of increase of the Schottky barrier height due to the present invention can be found from $\phi B1 - \phi B2$. Since $(\phi InGaN + \Delta Ec)$ and $\phi AlGaN$ are substantially equal, this amount of increase is substantially equal to Vpiezo. In other words, the present invention increases the Schottky barrier height by taking advantage of the piezoelectric polarization that is generated in a layer having compressive strain that is arranged directly beneath an electrode.

The first electron barrier layer of the present invention is provided for increasing the electron barrier of the second electron barrier layer. The second electron barrier layer is preferably formed over and in direct contact with the first electron barrier layer, but may also be formed on an interposed spacer layer having a thickness of, for example, 10 nm or less.

The base layer of the present invention is the thickest layer of the semiconductor layers that make up the semiconductor device, and is the layer that restricts the crystal systems of the other semiconductor layers. The strain modes of the other semiconductor layers are determined with this base layer as the standard. In other words, tensile strain is produced in layers having a lattice constant that is smaller than that of the base layer, and compressive strain is produced in layers having a lattice constant that is greater than that of the base layer.

When a semiconductor layer having a lattice constant that differs from that of the base layer is formed over the base layer, dislocation is generated and lattice relaxation occurs in the semiconductor layer if the semiconductor layer is thicker than a critical layer thickness. Thus, in order to generate sufficient piezoelectric polarization and make the effect of the present invention significant, the thickness of the semiconductor layer is preferably kept at or below the critical layer thickness. Nevertheless, lattice relaxation normally does not proceed to completion, and a fixed lattice strain remains even when the semiconductor layer is thicker than the critical layer thickness. As a result, a film thickness that exceeds the critical layer thickness can be adopted in the present invention if within the range in which a fixed piezoelectric effect can be obtained.

Although the first and second electron barrier layers are preferably less than the critical layer thickness as described hereinabove, there is no particular lower limit, and, for example, these layers may have a thickness that is only several times greater than the size of the atoms (on the order of 10 Å).

The critical layer thickness can be calculated using Matthews' Equation (J. W. Matthews and A. E. Blakeslee; Journal of Crystal Growth, 27 118 (1974)). FIGS. 6 and 7 show the calculation results. The parameters used in this calculation are shown in the following table.

|  | GaN | AlN | InN |
|---|---|---|---|
| Lattice constant (Å) | 3.180 | 3.111 | 3.533 |
| Poissons' ratio | 0.3 | 0.3 | 0.3 |

As described in the foregoing explanation, the provision of a layer having compressive strain below the Schottky electrode both enables the formation of a Schottky barrier of two-step structure having sufficient height and enables the effective prevention of leakage current below the electrode.

The above and other objects, features, and advantages of the present invention will become apparent from the following description with reference to the accompanying drawings which illustrate examples of the present invention.

BRIEF DESCRIPTION OF THE DRAWINGS

FIG. 5A shows the energy band structure of a semiconductor device of the prior art;

FIG. 5B shows the energy band structure of a semiconductor device of the first embodiment of the present invention;

FIG. 5C is a sectional view showing the structure of a semiconductor device of the prior art;

FIG. 5D is a sectional view showing the structure of a semiconductor device of the first embodiment of the present invention;

DETAILED DESCRIPTION OF THE PREFERRED EMBODIMENTS

[First Embodiment]

Figure 4A:
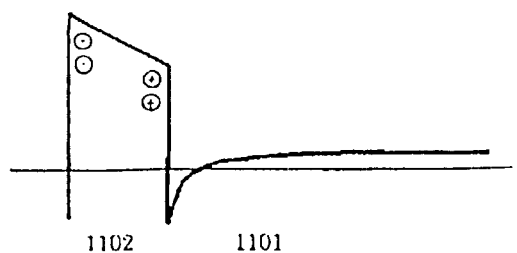
FIGS. 4A–4B are views for explaining the piezoelectric effect.
Figure 4B:
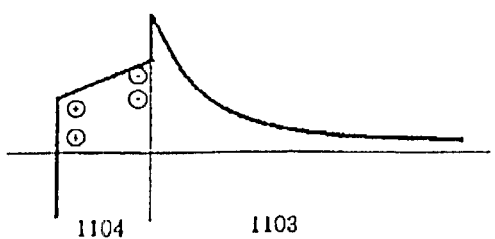
Figure 1:
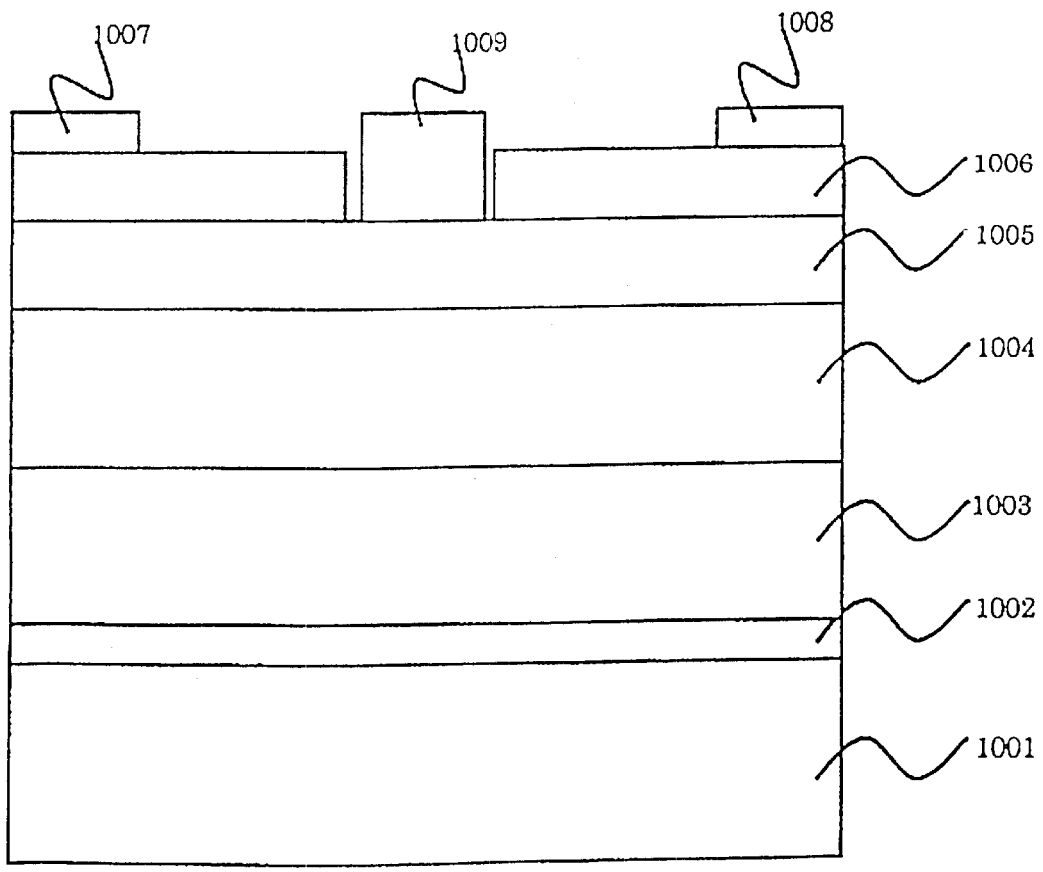
FIG. 1 is a sectional view showing the construction of a semiconductor device of the prior art.
Figure 2A:
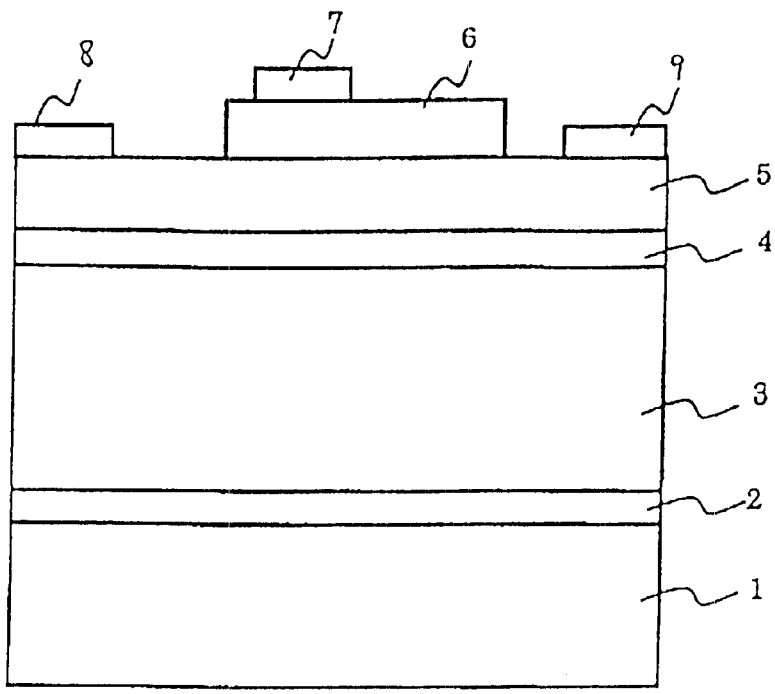
FIGS. 2A–2B are sectional views showing the construction of a semiconductor device of the first embodiment of the present invention.

FIG. 2A is a sectional view showing the structure of a field-effect transistor of the present embodiment. Carrier travel layer 3 is formed on substrate 1 with buffer layer 2 interposed, and spacer layer 4 and carrier supply layer 5 are formed on this carrier travel layer 3. Source electrode 8 and drain electrode 9 are provided on carrier supply layer 5 (the first electron barrier layer), and gate electrode 7 is further provided with Schottky layer 6 (the second electron barrier layer) interposed.

In addition to sapphire or silicon carbide, a III-nitride semiconductor such as GaN, AlGaN, and AlN can be used as substrate 1.

Buffer layer 2 is a low-temperature buffer layer that is formed at a low temperature on the order of 400–500° C. This buffer layer 2 plays the role of easing the strain caused by lattice mismatch between substrate 1 and the III-nitride semiconductor layer that is formed on the substrate.

Carrier travel layer 3, spacer layer 4, and carrier supply layer 5 are all composed of III-nitride semiconductor materials. The III-nitride semiconductor material is a semiconductor material including nitrogen and one or two or more Group-III elements selected from gallium, aluminum, and indium, and can be represented by $In_xGa_yAl_{(1-x-y)}N$; ($0 \leq x \leq 1$, $0 \leq y < 1$). Spacer layer 4 and carrier supply layer 5 are composed of materials having a lower electron affinity than carrier travel layer 3. Each layer may include impurities as appropriate. Silicon, sulfur, selenium (Si, S, and Se) may be added as n-type impurities, and beryllium, carbon, and magnesium (Be, C and Mg) may be added as p-type impurities.

In the present embodiment, carrier travel layer 3, which is thickest, is the base layer, and this layer is the standard for determining the strain mode of the other semiconductor layers. In other words, tensile strain is produced in layers having a smaller lattice constant than carrier travel layer 3, and compressive strain is produced in layers having a higher lattice constant than carrier travel layer 3.

Figure 2B:
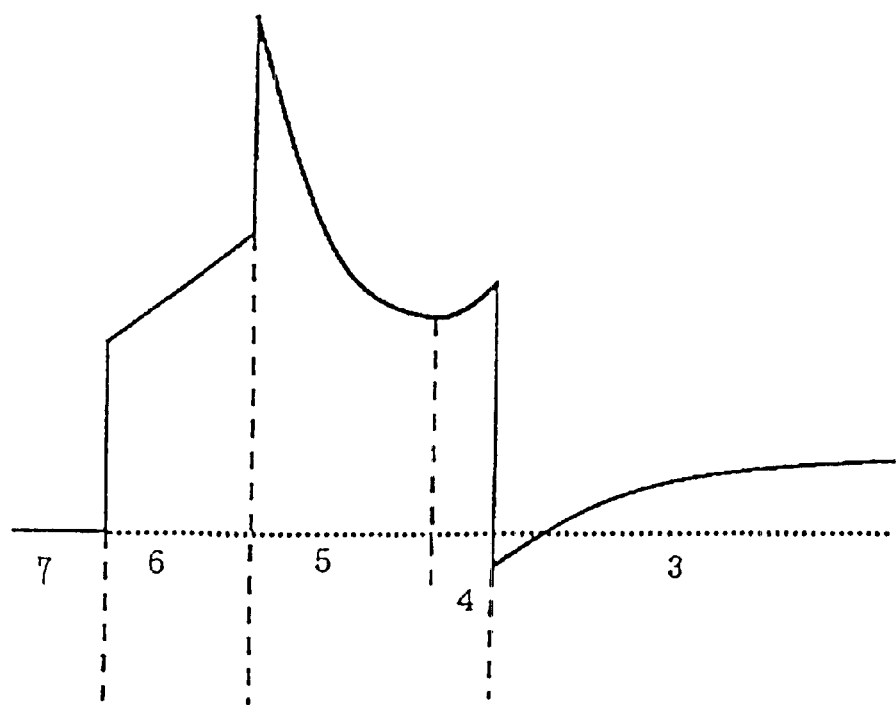
Figure 3:
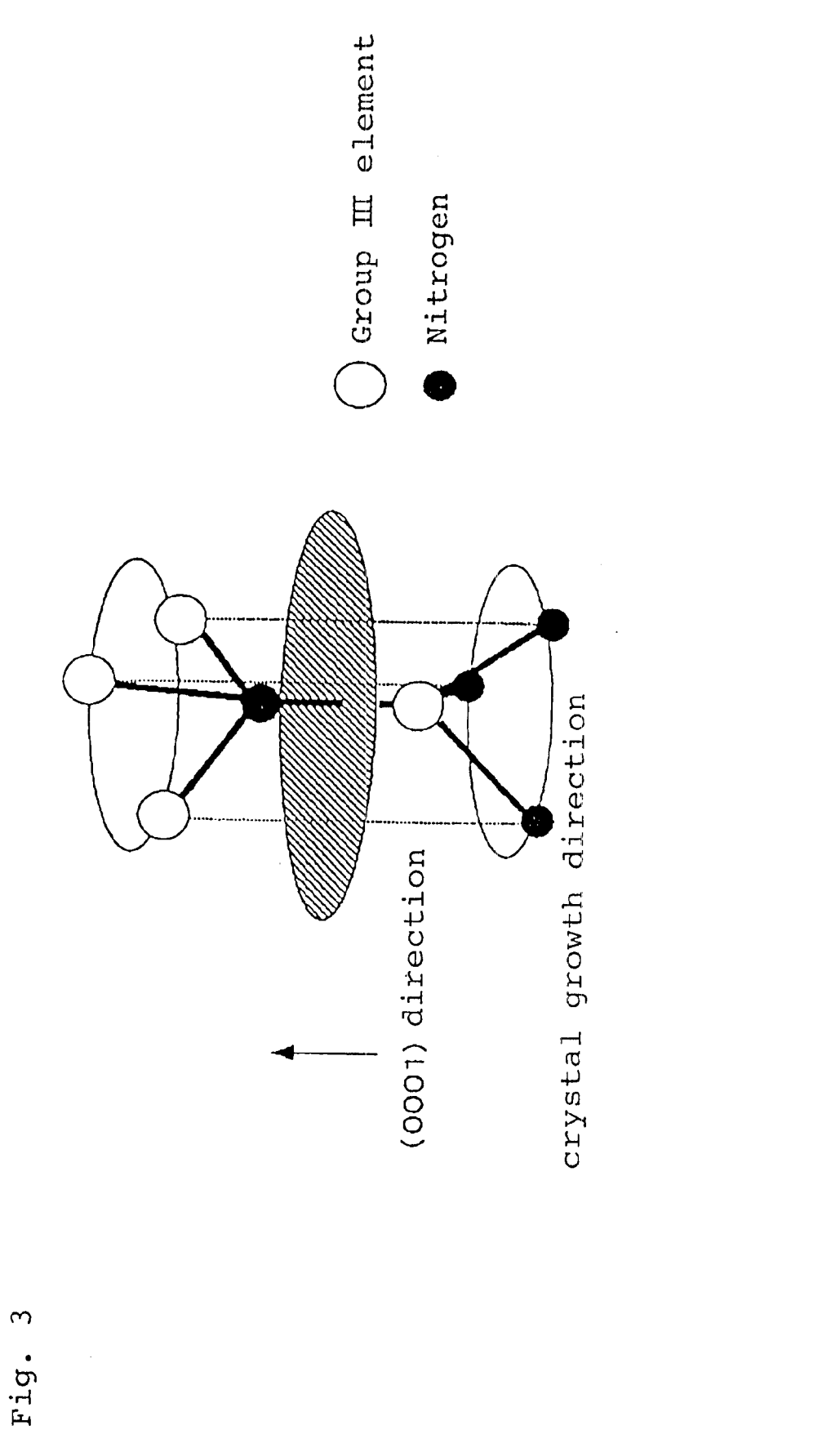
FIG. 3 shows the crystal structure of a wurtzite III-nitride semiconductor.
Figure 6:
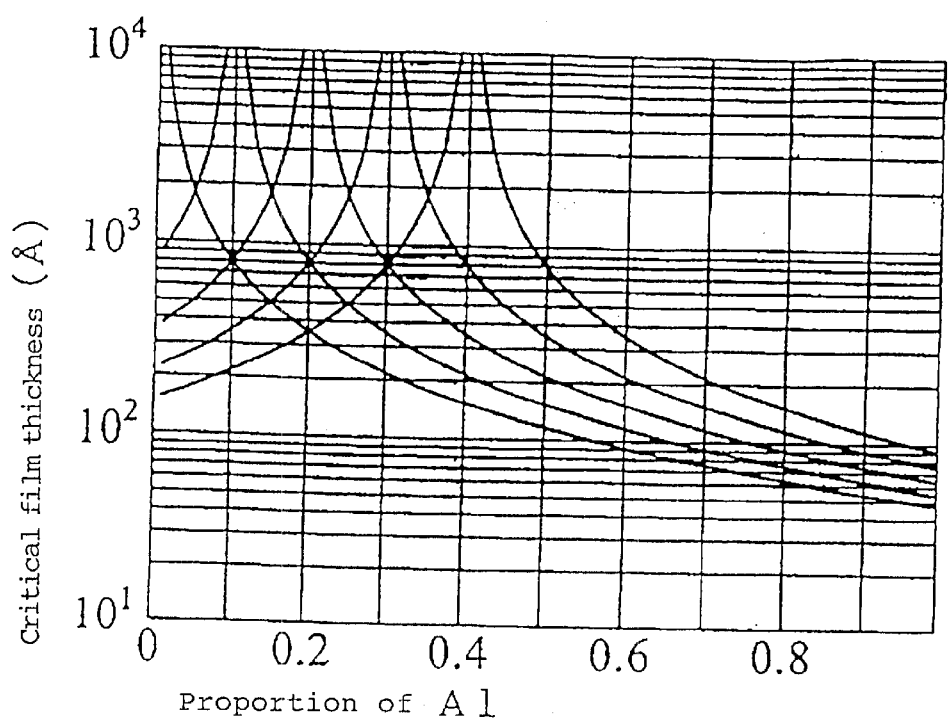
FIG. 6 shows the results of calculating critical layer thickness.
Figure 7:
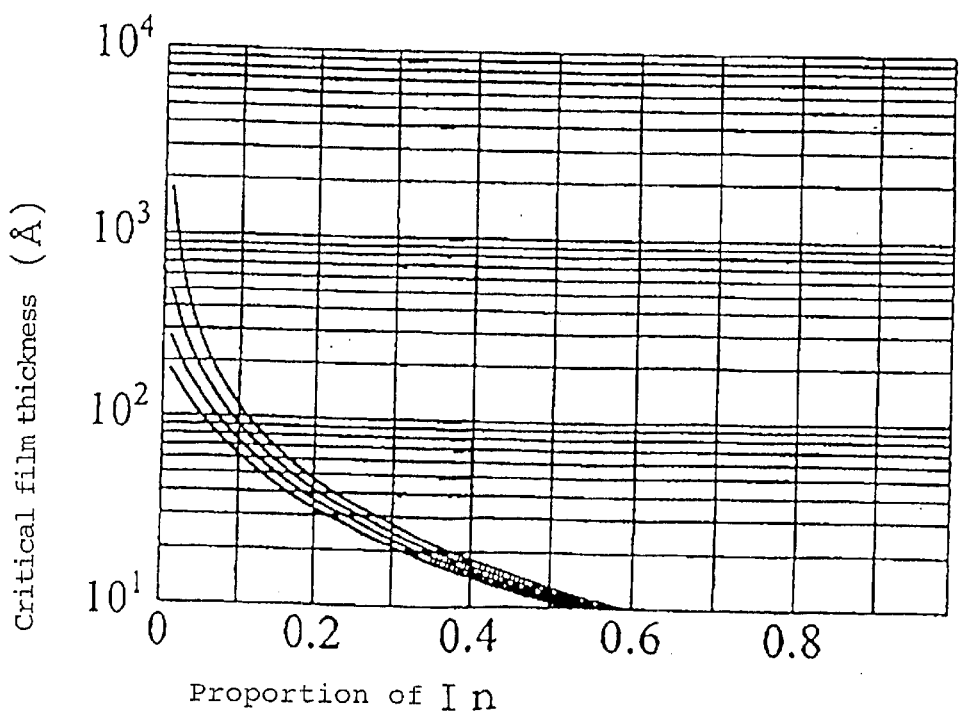
FIG. 7 shows the results of calculating critical layer thickness.

Schottky layer 6 is a structure having compressive strain in a horizontal plane that is perpendicular to the direction of thickness. Specifically, the lattice constant of Schottky layer 6 is higher than that of carrier travel layer 3, this configuration producing the energy band structure shown in FIG. 2B. In other words, the piezoelectric polarization that is caused by the compressive strain in Schottky layer 6 raises the Schottky barrier height of carrier supply layer 5 and creates an element configuration that suppresses leakage current.

A variety of materials can be used to constitute each of the semiconductor layers in this embodiment. For example, carrier travel layer 3 may be composed of GaN, spacer layer 4 and carrier supply layer 5 may be composed of AlGaN, and Schottky layer 6 may be composed of InGaN.

In a case in which carrier travel layer 3, which serves as the base layer, is composed of GaN, for example, the use of $(In_xAl_{(1-x)})_yGa_{(1-y)}N$; ($0.164 \leq x \leq 1$, $0 \leq y < 1$) to constitute Schottky layer 6 results in the creation of compressive strain in Schottky layer 6 and the production of a higher Schottky barrier in carrier supply layer 5.

From the standpoint of obtaining a sufficient piezoelectric effect, each of the III-nitride semiconductor layers that make up the elements in the present embodiment and in each of the embodiments described hereinbelow are preferably constituted by wurtzite semiconductor layers in which the (0001) plane is the principal plane. However, this stipulation is open to various modifications as long as a prescribed piezoelectric effect can be obtained. For example, the principal plane may be a plane inclined from the (0001) plane in any direction up to 55 degrees and preferably within 10 degrees.

Explanation is next presented in greater detail regarding a specific example of the present embodiment and a method of fabrication.

A c-plane ((0001) plane) sapphire substrate is employed as substrate 1, and on this substrate 1 are formed by Metalorganic Vapor-Phase Epitaxy (MOVPE): an AlN low-temperature growth buffer layer having a thickness of 20 nm as buffer layer 2; a GaN operating layer having a thickness of 1500 nm as carrier travel layer 3; an AlGaN spacer layer having a thickness of 5 nm as spacer layer 4; an AlGaN carrier supply layer (Al composition: 0.2; film thickness: 20 nm; amount of added Si: $5 \times 10^{18}$ cm$^{-3}$) as carrier supply layer 5; and an InGaN layer (In composition: 0.05; film thickness: 10 nm) as Schottky layer 6. The growth temperatures for the MOVPE method are as follows:

Buffer layer 2: 400–500° C. (for example, 450° C.)

Carrier travel layer 3: 1000–1050° C. (for example, 1030° C.)

Spacer layer 4, carrier supply layer 5 (AlGaN layer): 1040–1100° C. (for example, 1080° C.)

Schottky layer 6 (InGaN layer): 800–900° C. (for example, 840° C.)

Next, openings are provided by applying a photoresist and then exposure and developing, following which a portion of Schottky layer 6 is removed by dry etching (ECR method) using chlorine gas (Cl$_2$). Ti/Al (the thickness of the Ti layer: 10 nm, the thickness of the Al layer: 200 nm) is further formed as a first metal layer by electron gun evaporation. After liftoff, ramp annealing (650° C., 30 seconds) is carried out to form source electrode 8 and drain electrode 9. Openings are provided by applying a photoresist and then exposure and developing, following which Ni/Au (the thickness of the Ni layer: 10 nm; the thickness of the Au layer: 200 nm) are formed by electron gun evaporation as a second metal layer. Liftoff is then carried out to form gate electrode 7. The field-effect transistor is fabricated by carrying out the above-described steps.

In this field-effect transistor, compressive strain remains in Schottky layer 6 and tensile strain remains in carrier supply layer 5, whereby a piezoelectric effect induces a negative charge on the side of Schottky layer 6 that contacts carrier supply layer 5 and on the side of carrier supply layer 5 that contacts Schottky layer 6. In other words, a field is generated in a direction that pushes up the conduction band of the interface of these layers toward the high energy region. As a result, leakage current at the Schottky junction can be reduced, and a superior current amplification characteristic can be realized even in a case in which a gate bias is applied in the positive direction. In addition, the distance between the gate electrode and operating layer and the doping concentration Vt can be independently controlled by adjusting the proportions of each of the components indium, aluminum, and gallium (In, Al, and Ga).

Although sapphire is used as the substrate in the present embodiment, any other substrate such as silicon carbide can be used. Furthermore, although the c-plane (the (0001) plane) of the sapphire substrate is used in this embodiment, the present invention is not limited to the use of this plane, and any plane may be used as long as the III-nitride semiconductor is grown with a c-axis orientation or with an orientation having an inclination from the c-axis of up to approximately 55 degrees in any direction, and as long as a piezoelectric effect is produced in the same direction as the present embodiment. For example, apart from a sapphire c-plane substrate, a substrate having an inclination in any direction from the c-plane may be used. However, when a substrate having an inclination from the sapphire c-plane or a-plane is used, good crystallinity becomes difficult to obtain as the angle of inclination increases, and an angle of 10 degrees or less in any direction is preferable.

Although GaN is used as carrier travel layer 3 in the present embodiment, other III-nitride semiconductor materials can also be used as appropriate.

Although each layer can be formed in any thickness, a thickness is preferable that is less than the critical layer thickness at which transformation occurs.

In the present embodiment, no impurities are added in the GaN carrier travel layer. This is because the N-vacancies in GaN behave similar to n-type impurities and emit electrons, and moreover, have a concentration of approximately $5 \times 10^{16}$ cm$^{-3}$, thereby eliminating the need to add impurities. n-type impurities such as silicon, sulfur, and selenium (Si, S, and Se) can be added. In addition, p-type impurities such as beryllium and carbon (Be and C) may also be added.

Although Ti/Al are used as the source electrode and drain electrode in the present embodiment, the source electrode and drain electrode can be made of any metal that realizes ohmic contact with the GaN that is the carrier supply layer in the present embodiment, and metals such as tungsten, molybdenum, silicon, titanium, platinum, aluminum, and gold (W, Mo, Si, Ti, Pt, Al, and Au) may be used, and a structure in which a plurality of these metals are formed may also be used.

Furthermore, although Ni/Au are used as the gate electrodes in the present embodiment, the gate electrode can be made of any metal that establishes Schottky contact with the GaN that is the carrier supply layer in the present embodiment, and metals such as tungsten, molybdenum, silicon, titanium, platinum, aluminum, and gold (W, Mo, Si, Ti, Pt, Al, and Au) may also be used, and a structure in which a plurality of these metals are formed may also be used.

[Second Embodiment]

Figure 8:
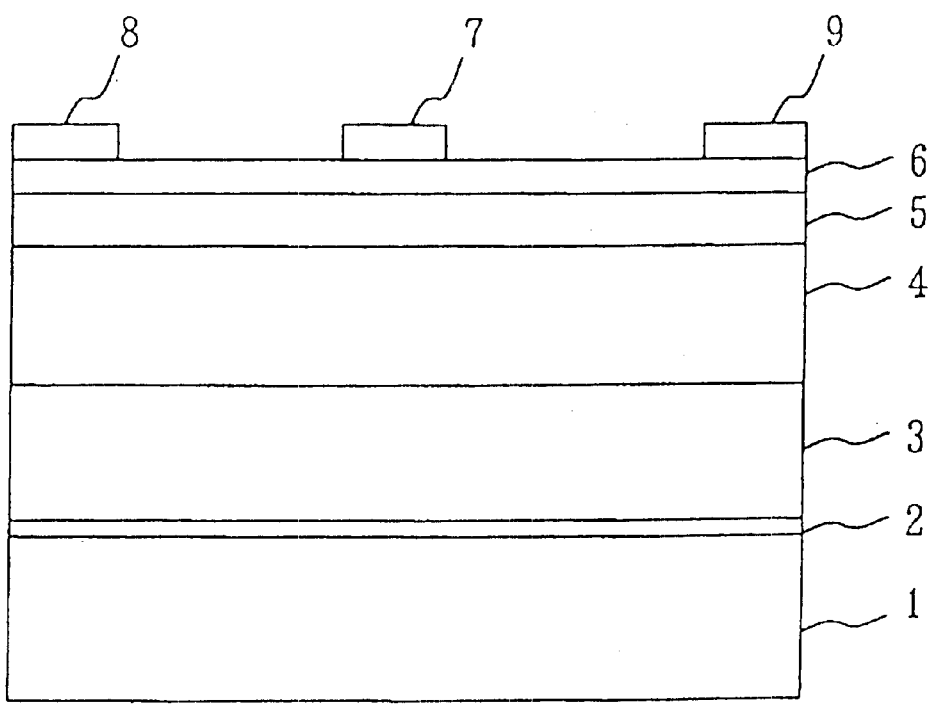
FIG. 8 is a sectional view showing the structure of the semiconductor device of the second embodiment of the present invention.

FIG. 8 shows a section of the structure of the field-effect transistor of this embodiment. Carrier travel layer 3 is formed on substrate 1 with low-temperature buffer layer 2 interposed, and spacer layer 4, carrier supply layer 5, and Schottky layer 6 are formed on this carrier travel layer 3. Source electrode 8, drain electrode 9, and gate electrode 7 are provided on Schottky layer 6. The materials of each of substrate 1, low-temperature buffer layer 2, carrier travel layer 3, spacer layer 4, carrier supply layer 5, and Schottky layer 6 may be the same as materials used in the first embodiment. Schottky layer 6 is composed of a material having a higher lattice constant than carrier travel layer 3, and has compressive strain in the horizontal plane that is perpendicular to the direction of film thickness. Piezoelectric polarization is therefore produced by this compressive strain in Schottky layer 6, and the Schottky barrier height of carrier supply layer 5 is increased.

Because an etching step for the GaN semiconductor is not necessary, the field-effect transistor of this embodiment has the advantage of easier processing.

[Third Embodiment]

Figure 9:
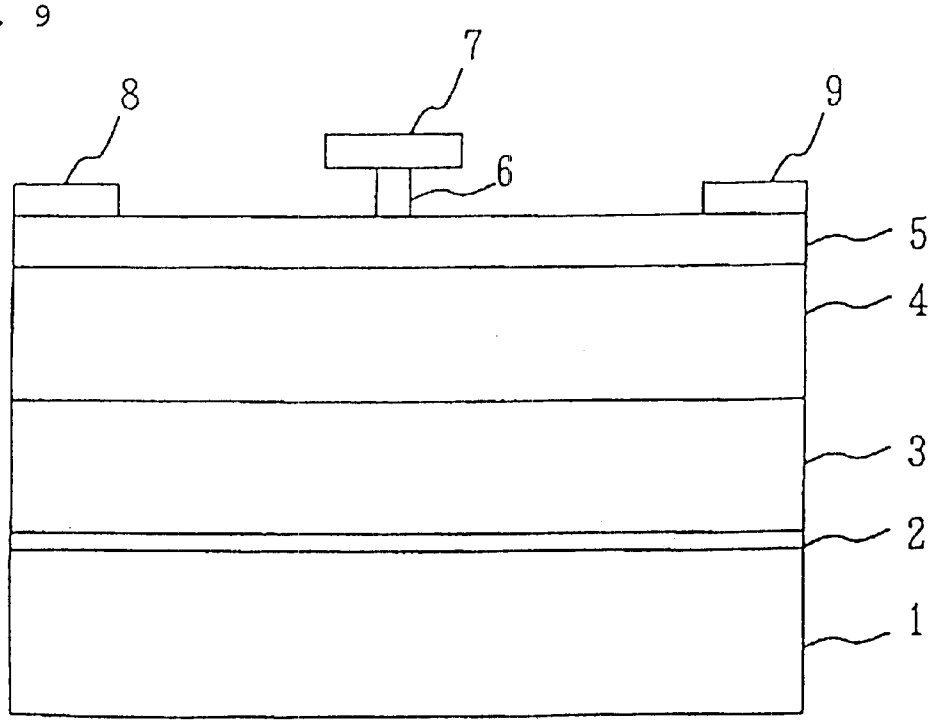
FIG. 9 is a sectional view showing the structure of the semiconductor device of the third embodiment of the present invention.

FIG. 9 shows a sectional view of the construction of a field-effect transistor according to this embodiment. This embodiment has the advantage of realizing a shorter practical gate length, which is the length of the part that can really function as gate electrode, because Schottky layer 6 is shorter than gate electrode member 7 in left and right direction in FIG. 9. Schottky layer 6 of this embodiment can be easily made shorter as shown in FIG. 9 by side etching.

[Fourth Embodiment]

Figure 10:
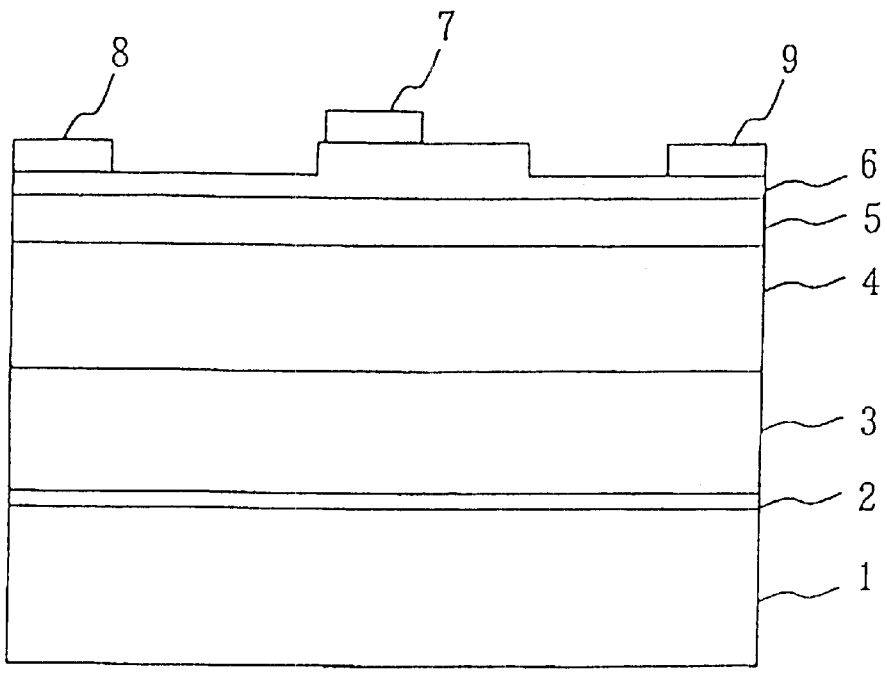
FIG. 10 is a sectional view showing the structure of the semiconductor device of the fourth embodiment of the present invention.

FIG. 10 shows a sectional view of the construction of a field-effect transistor according to this embodiment. In this embodiment, Schottky layer 6 below gate electrode 7 is a thick film, and Schottky layer 6 below source electrode 8 and drain electrode 9 is a thin film. Since carrier supply layer 5 is not exposed in the etching step of Schottky layer 6, there is no need for selective etching to remove only Schottky layer 6 without removing carrier supply layer 5, and the rigorous conditions required for etching can be relaxed. This embodiment also has the advantage of eliminating the danger of damage to carrier supply layer 5.

In this embodiment, Schottky layer 6 extends toward the drain electrode side, and the field concentration between the gate electrode and drain electrode can therefore be eased.

[Fifth Embodiment]

Figure 11:
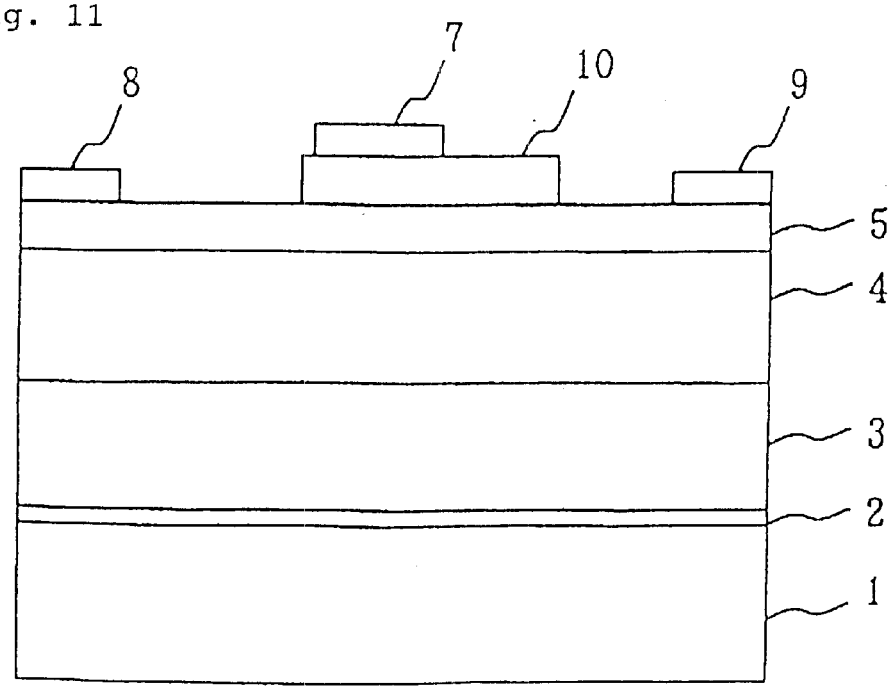
FIG. 11 is a sectional view showing the structure of the semiconductor device of the fifth embodiment of the present invention.

FIG. 11 is a sectional view showing the construction of a field-effect transistor according to the present embodiment. In this embodiment, Schottky layer 10 is composed of GaN. The Schottky barrier that is produced in carrier supply layer 5 can be increased because the upper surface of Schottky layer 10 has negative polarization.

[Sixth Embodiment]

Figure 12:
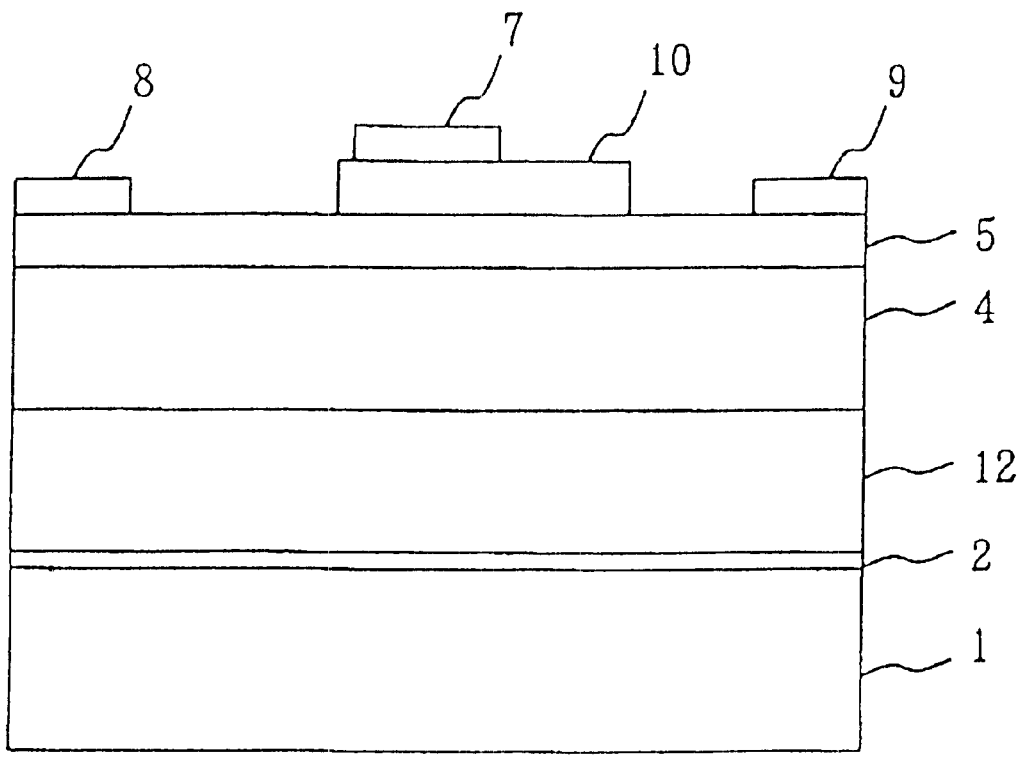
FIG. 12 is a sectional view showing the structure of the semiconductor device of the sixth embodiment of the present invention.

FIG. 12 is a sectional view showing the construction of a field-effect transistor according to this embodiment. In this embodiment, substrate 12, which is the base layer, is composed of AlGaN, which has a relatively small lattice constant, whereby compressive strain is produced in Schottky layer 10 that is composed of GaN. As a result, the height of the Schottky barrier that is produced in carrier supply layer 5 can be effectively increased.

[Seventh Embodiment]

Figure 13:
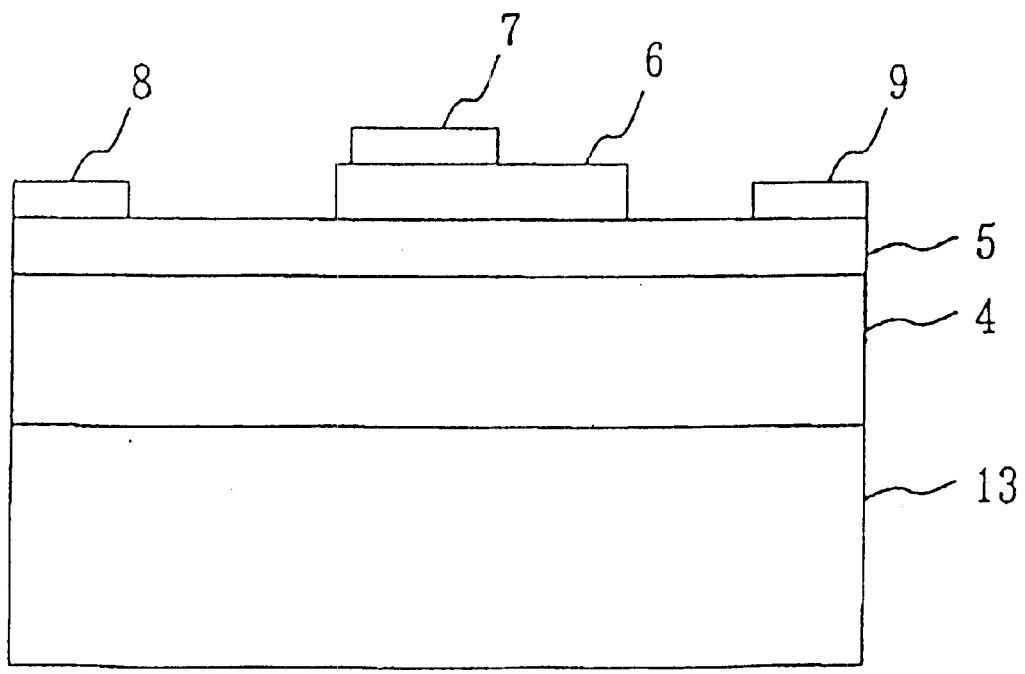
FIG. 13 is a sectional view showing the structure of the semiconductor device of the seventh embodiment of the present invention.

FIG. 13 is a sectional view showing the construction of a field-effect transistor according the present embodiment. This embodiment employs substrate 13 that is composed of GaN. Substrate 13 can be obtained by, for example, forming a thick GaN layer on a sapphire substrate with a low-temperature buffer layer interposed and then removing the sapphire substrate by etching.

[Eighth Embodiment]

Figure 14:
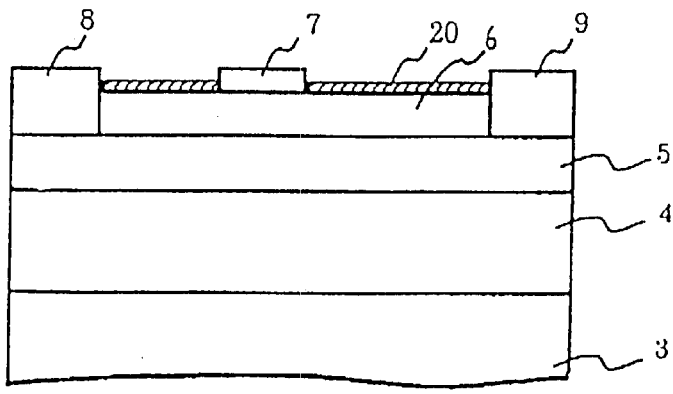
FIG. 14 is a sectional view showing the structure of the semiconductor device of the eighth embodiment of the present invention.

FIG. 14 is a sectional view showing the construction of a field-effect transistor according to the present embodiment. In this embodiment, source electrode 8 and drain electrode 9 are provided on carrier supply layer 5, and gate electrode 7 is provided in another portion with Schottky layer 6 interposed. Schottky layer 6 is covered by protective film 20 to prevent contact with the air. By adopting this construction in which Schottky layer 6 is covered by protective layer 20, charge is not induced in the vicinity of the surface of Schottky layer 6 and the operation of the element can be stabilized.

Protective layer 20 may be constituted by a film of silicon nitride, silicon oxide, or silicon oxynitride.

[Ninth Embodiment]

Figure 15:
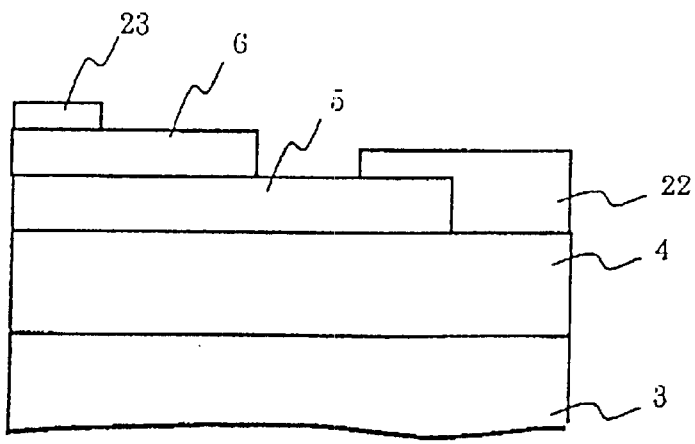
FIG. 15 is a sectional view showing the structure of the semiconductor device of the ninth embodiment of the present invention.

FIG. 15 is a sectional view showing the construction of a Schottky diode according to the present embodiment.

Carrier travel layer 3 is formed on a substrate (not shown in the figure) with a buffer layer interposed (not shown), and spacer layer 4, carrier supply layer 5, and Schottky layer 6 are formed on this carrier travel layer 3. Buffer layer 23 is provided on Schottky layer 6, and buffer layer 22 is provided on spacer layer 4 and carrier supply layer 5. Schottky layer 6 is composed of a material having a higher lattice constant than carrier travel layer 3 and has compressive strain in a horizontal plane that is perpendicular to the direction of film thickness. Piezoelectric polarization is therefore produced in Schottky layer 6 due to this compressive strain, and the Schottky barrier height of carrier supply layer 5 increases. Superior contact resistance can be obtained because buffer layer 22 is formed on spacer layer 4 that has tensile strain and carrier supply layer 5 that has no strain.

[Tenth Embodiment]

Figure 16:
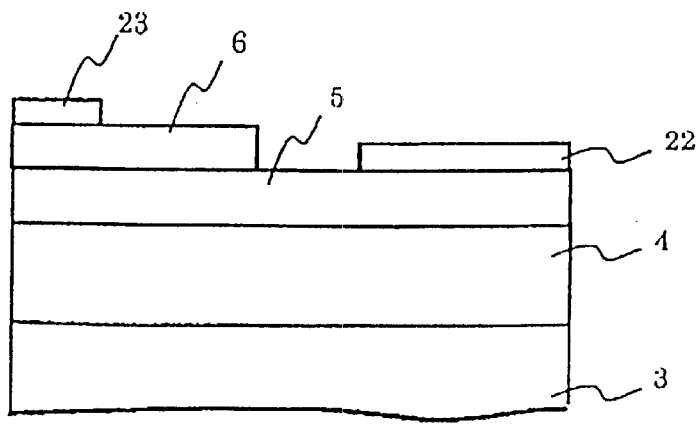
FIG. 16 is a sectional view showing the structure of the semiconductor device of the tenth embodiment of the present invention.

FIG. 16 is a sectional view showing the construction of a Schottky diode according to the present embodiment. This embodiment has a construction that is similar to the ninth embodiment but differs in that buffer layer 22 contacts only carrier supply layer 5. This construction allows a simpler fabrication process than the ninth embodiment but results in slightly higher contact resistance of buffer layer 22.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:

a first electron barrier layer;

a second electron barrier layer formed on said first electron barrier layer either directly or on an interposed spacer layer and in which a negative piezoelectric charge is induced on said first electron barrier layer side and a positive piezoelectric charge is induced on the opposite side; and a Schottky electrode of sufficient height formed on the side of said second electron barrier layer in which said positive piezoelectric charged is induced.

2. A semiconductor device according to claim 1, wherein said first electron barrier layer and said second electron barrier layer are both composed of III-nitride semiconductor materials.

3. A semiconductor device according to claim 1, wherein said Schottky electrode is a gate electrode, and further comprising a source electrode and a drain electrode.

4. A semiconductor device according to claim 3, wherein said source electrode and said drain electrode are formed in contact with a III-nitride semiconductor layer that has no strain or that has tensile strain.

5. The new semiconductor device according to claim 1, wherein said second electron barrier layer is formed from a material having a lattice constant larger than a thick base layer.

6. The semiconductor device according to claim 1, further comprising a carrier travel layer formed on a substrate with a buffer layer interposed, wherein said lattice constant of said second electron barrier layer is higher than a constant of said carrier travel layer.

7. A semiconductor device according to claim 1, further comprising:

a semiconductor layer with a compressive strain formed directly beneath said Schottky electrode.

8. A semiconductor device according to claim 1, wherein a negative piezoelectric charge is induced in said second electron barrier layer side of said first electron barrier layer and a postive piezoelectric charge is induced on the opposite side of said first electron barrier layer.

9. A semiconductor device according to claim 8, wherein said first electron barrier layer and said second electron barrier layer are both composed of III-nitride semiconductor materials.

10. A semiconductor device comprising:

a base layer that is a wurtzite III-nitride semiconductor layer in which the (0001) plane is the principal plane;

a first electron barrier layer that is formed on said base layer and that is a wurtzite III-nitride semiconductor layer in which the (0001) plane is the principal plane;

a second electron barrier layer formed on said first electron barrier layer either directory or on an interposed spacer layer, said second electron barrier layer being a wurtzite III-nitride semiconductor layer in which the (0001) plane is the principal plane and having compressive strain; and a Schottky electrode that is formed on said second electron barrier layer.

11. A semiconductor device according to claim 10, wherein said first electron barrier layer has tensile strain.

12. A semiconductor device according to claim 10, wherein said Schottky electrode is a gate electrode and further comprising a source electrode and a drain electrode.

13. A semiconductor device according to claim 12, wherein said source electrode and said drain electrode are formed in contact with a III-nitride semiconductor layer that has no strain or that has tensile strain.

14. A semiconductor device comprising:

a base layer that is a wurtizte III-nitride semiconductor layer in which the (001) plane is the principal plane;

a first electron barrier layer that is formed on said base layer that is a wurtzite III-nitride semiconductor layer in which the (001) plane is the principal plane;

a second electron barrier layer that is formed on said first electron barrier layer either directly or on an interposed spacer layer, said second electron barrier layer being a wurtzite III-nitride semiconductor layer in which the (001) plane is the principal plane, and having a greater average lattice constant than that of said base layer, where the average lattice constant is defined as the average value of the lattice constant in the horizontal plane that is perpendicular to the direction of film thickness; and a Schottky electrode that is formed on said second electron barrier layer.

15. A semiconductor device according to claim 14, wherein the average lattice constant of said first electron barrier layer is equal to or smaller than the average lattice constant of said base layer.

16. A semiconductor device according to claim 15, wherein:

said base layer is composed of $Al_\alpha Ga_{(1-\alpha)}N$; ($0 \leq \alpha \leq 1$);

said first electron barrier layer is composed of $Al_\beta Ga_{(1-\beta)}N$; ($\alpha \leq \beta \leq 1$); and said second electron barrier layer is composed of $In_x Ga_y Al_{(1-x-y)}N$; ($0 < x \leq 1$, $0 \leq y < 1$).

17. A semiconductor device according to claim 15, wherein:

said base layer is composed of $Al_\alpha Ga_{(1-\alpha)}N$; ($0 < \alpha \leq 1$);

said first electron barrier layer is composed of $Al_\beta Ga_{(1-\beta)}N$; ($\alpha \leq \beta \leq 1$); and said second electron barrier layer is composed of $Al_\gamma Ga_{(1-\gamma)}N$; ($0 \leq \gamma \leq \alpha$).

18. A semiconductor device according to claim 14, wherein said Schottky electrode is a gate electrode and further comprising a source electrode and a drain electrode.

19. A semiconductor device according to claim 18, wherein said source electrode and said drain electrode are formed in contact with a III-nitride semiconductor layer that has no strain or that has tensile strain.

20. A semiconductor device comprising:

a plurality of wurtzite III-nitride semiconductor layers in which the (0001) plane is the principal plane including a first layer composed of GaN and a second layer composed of $Al_x Ga_{(1-x)}N$; ($0 < x \leq 1$);

a gate electrode that is formed on said III-nitride semiconductor layers so as to contact said first layer; and a source electrode and a drain electrode formed on said III-nitride semiconductor layers so as to contact said second layer.

* * * * *